(12) United States Patent
Yagihashi et al.

(10) Patent No.: US 7,119,354 B2
(45) Date of Patent: Oct. 10, 2006

(54) COMPOSITION FOR FORMING POROUS FILM, POROUS FILM AND METHOD FOR FORMING THE SAME, INTERLEVEL INSULATOR FILM

(75) Inventors: Fujio Yagihashi, Niigata-ken (JP); Yoshitaka Hamada, Niigata-ken (JP); Hideo Nakagawa, Oumihachiman (JP); Masaru Sasago, Hirakata (JP)

(73) Assignees: Shin-Etsu Chemical Co., Ltd., Tokyo (JP); Matsushita Electric Industrial Co., Ltd., Osaka (JP)

( * ) Notice: Subject to any disclaimer, the term of this patent is extended or adjusted under 35 U.S.C. 154(b) by 101 days.

(21) Appl. No.: 10/810,360

(22) Filed: Mar. 26, 2004

(65) Prior Publication Data

US 2004/0201007 A1    Oct. 14, 2004

(30) Foreign Application Priority Data

Apr. 9, 2003    (JP)    ............................. 2003-104774

(51) Int. Cl.
*H01L 47/00*    (2006.01)
(52) U.S. Cl. ................................. 257/3; 257/3; 257/93
(58) Field of Classification Search .................... 257/3, 257/93, 130, 386
See application file for complete search history.

(56) References Cited

U.S. PATENT DOCUMENTS

| | | | |
|---|---|---|---|
| 4,634,509 A | 1/1987 | Shimizu et al. | |
| 5,494,859 A | 2/1996 | Kapoor | |
| 5,707,783 A | 1/1998 | Stauffer et al. | |
| 6,037,275 A | 3/2000 | Wu et al. | |
| 6,197,913 B1 | 3/2001 | Zhong | |
| 6,313,045 B1 | 11/2001 | Zhong et al. | |
| 6,359,096 B1 | 3/2002 | Zhong et al. | |
| 6,376,634 B1 | 4/2002 | Nishikawa et al. | |
| 6,391,999 B1 | 5/2002 | Crivello | |
| 6,413,647 B1 | 7/2002 | Hayashi et al. | |
| 6,512,071 B1 | 1/2003 | Hacker et al. | |
| 6,533,855 B1 * | 3/2003 | Gaynor et al. ......... 106/287.14 |
| 6,534,025 B1 | 3/2003 | Yano et al. | |
| 6,596,404 B1 | 7/2003 | Albaugh et al. | |
| 6,632,489 B1 | 10/2003 | Watanabe et al. | |

(Continued)

FOREIGN PATENT DOCUMENTS

EP    1 205 438 A1    5/2002

(Continued)

OTHER PUBLICATIONS

Inagaki et al., "Synthesis of Highly Ordered Mesoporous Materials from a Layered Polysilicate," *J. Chem. Soc., Chem. Commun.*, pp. 680-682, 1993.

(Continued)

*Primary Examiner*—Ngân V. Ngô
*Assistant Examiner*—Thinh T Nguyen
(74) *Attorney, Agent, or Firm*—Alston & Bird LLP

(57) ABSTRACT

Provided is a coating liquid which can easily form a porous film having desirably controlled thickness by the method used for a usual semiconductor process, and having an excellent mesopore channel structure. Specifically provided is a composition for forming porous film comprising a surfactant, an aprotic polar solvent and a solution comprising a polymer formed by hydrolysis and condensation of one or more silane compounds represented by foramula (1): $RnSi(OR')_{4-n}$. Also provided is a method for manufacturing a porous film comprising steps of applying said composition so as to form a film, drying the film and transforming the dried film to a porous film by removing said surfactant. The porous film obtained from the composition for forming porous film is further provided.

8 Claims, 1 Drawing Sheet

U.S. PATENT DOCUMENTS

| | | |
|---|---|---|
| 6,639,015 B1 | 10/2003 | Nakashima et al. |
| 6,696,538 B1 | 2/2004 | Ko et al. |
| 2002/0020327 A1 | 2/2002 | Hayashi et al. |
| 2002/0098279 A1 | 7/2002 | Lyu et al. |
| 2002/0155053 A1 | 10/2002 | Nishiyama et al. |
| 2002/0160207 A1 | 10/2002 | Kohmura et al. |
| 2003/0064321 A1 | 4/2003 | Malik et al. |
| 2003/0091838 A1 | 5/2003 | Hayashi et al. |
| 2003/0104225 A1 | 6/2003 | Shiota et al. |
| 2003/0157311 A1 | 8/2003 | MacDougall et al. |

FOREIGN PATENT DOCUMENTS

| | | |
|---|---|---|
| EP | 1223192 | 7/2002 |
| EP | 1245642 | 10/2002 |
| EP | 1 123 753 A2 | 8/2003 |
| JP | 63-015355 | 4/1988 |
| JP | 05-125191 | 5/1993 |
| JP | 06-145599 | 5/1994 |
| JP | 9-194298 | 7/1997 |
| JP | 11-246665 | 9/1999 |
| JP | 2000-44875 | 2/2000 |
| JP | 2002-30249 | 7/2000 |
| JP | 2000-309751 | 11/2000 |
| JP | 2000-309753 | 11/2000 |
| JP | 2000-345041 | 12/2000 |
| JP | 2001-002993 | 1/2001 |
| JP | 2001-049178 | 2/2001 |
| JP | 2001-049179 | 2/2001 |
| JP | 2001-055554 | 2/2001 |
| JP | 2001-080915 | 3/2001 |
| JP | 2001-98218 | 4/2001 |
| JP | 2001-115021 | 4/2001 |
| JP | 2001-115028 | 4/2001 |
| JP | 2001-115029 | 4/2001 |
| JP | 2001-130911 | 5/2001 |
| JP | 2001-131479 | 5/2001 |
| JP | 2001-157815 | 6/2001 |
| JP | 2001-164186 | 6/2001 |
| JP | 2001-203197 | 7/2001 |
| JP | 2001-240798 | 9/2001 |
| JP | 2001-354904 | 12/2001 |
| JP | 2002-020688 | 1/2002 |
| JP | 2002-020689 A | 1/2002 |
| JP | 2002-023354 | 1/2002 |
| JP | 2002-030249 A | 1/2002 |
| JP | 2002-038090 A | 2/2002 |
| WO | WO 00/12640 | 3/2000 |
| WO | WO 03/088344 | 10/2003 |

OTHER PUBLICATIONS

Burkett et al., "Synthesis Of Hybrid Inorganic-Organic Mesoporous Silica By Co-Condensation Of Siloxane And Organosiloxane Precursors," *J. Chem. Soc. Chem. Commun.*, 1996, 1367-1368.

\* cited by examiner

COMPOSITION FOR FORMING POROUS FILM, POROUS FILM AND METHOD FOR FORMING THE SAME, INTERLEVEL INSULATOR FILM

BACKGROUND OF THE INVENTION

1. Field of the Invention

The present invention relates to a composition for film formation which can be formed into a porous film which excels in dielectric properties, adhesion, film uniformity and mechanical strength, and has reduced moisture absorption; a porous film and a method for forming the same; and a semiconductor device which contains the porous film inside.

2. Description of the Related Art

In the fabrication of semiconductor integrated circuits, as the circuits are packed tighter, an increase in interconnection capacitance, which is a parasitic capacitance between metal interconnections, leads to an increase in interconnection delay time, thereby hindering the enhancement of the performance of semiconductor circuits. The interconnection delay time is called an RC delay which is in proportion to the product of the electric resistance of the metal interconnections and the static capacitance between the interconnections. Reducing the interconnection delay time requires reducing the resistance of metal interconnections or the interconnection capacitance.

The reduction in resistance of the interconnection metal and the interconnection capacitance can prevent a densely packed semiconductor device from causing an interconnection delay, thereby realizing a smaller and faster semiconductor device with reduced power consumption.

In an attempt to reduce the resistance of metal interconnections, in recent years, metallic copper interconnections have been employed more than conventional aluminum interconnections in the structure of a device. However, use of this structure alone has limits in the enhancement of the performance, so the reduction in interconnection capacitance is an urgent necessity for higher performance of semiconductors.

One method for reducing interconnection capacitance is to reduce the relative permittivity (dielectric constant) of an interlevel insulator film disposed between metal interconnections. As such an insulator film with a low relative permittivity, it has been considered to use a porous film instead of a silicon oxide film which has been used conventionally. A porous film can be said to be the only practical film as a material with a relative permittivity of 2.0 or less, and various methods for forming a porous film have been proposed.

A first method for forming a porous film is as follows: a precursor solution of a siloxane polymer containing a thermally unstable organic component is synthesized; then the precursor solution is applied on the substrate to form a coating film; and later, a heat treatment is applied to decompose and volatilize the organic component. The result is a number of micro-pores formed in the film.

As a second method for forming a porous film, it is well known to carry out processing as follows: a silica sol solution is applied onto a substrate by coating or using a CVD method so as to form a wet gel; and then the silica sol is subjected to a condensation reaction while restricting volume reduction by controlling the speed of the evaporation of the solvent from the wet gel.

As a third method for forming a porous film, it is well known that a silica micro-particle solution is applied on a substrate to form a coating film, and then the coating film is sintered to form a number of micro-pores between silica micro-particles.

As a fourth method, Japanese Patent Provisional Publication No. 2000-44875 proposes a composition for porous film formation which is characterized by containing a compound having (A) a component expressed by $(R')_m Si(OR'')_{4-n}$ ($R'$ and $R''$ are univalent organic radicals, and m is an integer of 0 to 2); (B) a metal chelate compound; and (C) a compound having a polyalkylene oxide structure.

However, these methods have respective major drawbacks as follows.

In the first method for forming a porous film, the synthesis of the precursor solution of the siloxane polymer increases the cost. In addition, the formation of the coating film by coating the precursor solution increases the amount of silanol groups remaining in the coating film, which causes a degassing phenomenon indicating the evaporation of water and the like in the heat treatment process that is conducted later and which also deteriorates the film quality due to the porous film absorbing humidity.

In the second method for forming a porous film, the speed control of the evaporation of the solvent from the wet gel requires a special type of coating device, which increases the cost. In addition, a significant amount of silanol remains on the surface of the micro-pores which must be silanized because otherwise hygroscopicity is high so that the film quality decreases. The silanization makes the process more complicated. In the case where a wet gel is formed by the CVD process, it is necessary to use a special type of CVD device which is different from the plasma CVD device generally used in the semiconductor process, thereby also increasing the cost.

In the third method for forming a porous film, the diameter of the micro-pores formed between the silica micro-particles, which is determined by the accumulation structure of the silica micro-particles that are accumulated geometrically, becomes very large. This makes it difficult to set the relative permittivity of the porous film to 2 or below.

In the case of the fourth method, out of the three components (A), (B), and (C), the metal chelate compound of (B) is essential to increase the compatibility of the components (A) and (C), and to make the thickness of the coating film uniform after being hardened. However, it is not preferable because it makes the manufacturing process complicated and increases the cost. Therefore, it is desired to develop a material which enables a homogeneous solution to be formed without a chelate component and the coating film to be flat after being hardened.

In comparison to the conventional method for forming a porous film, it has been found that a porous member having a channel structure of mesopore size (micro-pores with diameters of 2 to 50 nm) can be formed as follows: alumino silicate, silica, or the like is condensed while using a micelle made from a surface-active agent as a mold so as to form the structure, and then the surface-active agent component is removed by sintering or solvent extraction. For example, Inagaki et al. propose making polysilicates react in water while using a surface-active agent as a mold (J. Chem. Soc. Chem. Commun., p. 680, 1993). Furthermore, Japanese Patent Provisional Publication No. 9-194298 discloses that tetraalkoxysilane is reacted in acid conditions in water while using a surface-active agent as a mold, and is applied onto the substrate so as to form a silica porous film having micro-pores of diameters of 1 to 2 nm.

However, these methods have problems as follows. In the first method, the powdered porous member can be easily formed, but it is impossible to form a porous film as a thin film on the substrate which is used for the fabrication of semiconductor devices. In the second method, a porous member can be formed into a thin film, but it is impossible to control the orientation of micro-pores, and it is also impossible to form a uniform thin film in a wide area.

Japanese Patent Provisional Publication No. 2001-130911 discloses a method for forming a silica mesoporous thin film by using a mixture of an acid hydrolysis condensate of a silicon alkoxide and a surface-active agent after adjusting the mixture to pH 3 or below for stabilization.

However, in this method, too, the restriction of the solute concentration makes it difficult to properly control the thickness of a coating film, thereby making it difficult to apply it to a practical semiconductor fabrication process. When this solution is diluted with water, the thickness of the coating film becomes controllable, but the speed of polycondensation of the silica component increases to lose stability of the coating solution.

As mentioned above, the conventional materials have several problems such as deterioration of the film quality during the heat treatment step and high cost. Moreover, the formation of the porous film results in pores having a large diameter so that it is difficult to obtain the low dielectric constant. When the conventional porous film is incorporated into the multi-level interconnects of the semiconductor device as an insulator film, there is a problem that the mechanical strength necessary for the semiconductor device is not obtained.

Thus, when the dielectric constant of the porous film used as an insulator film in the multi-level interconnects of the semiconductor device is too high, the RC delay in the multi-level interconnects of the semiconductor device is increased so that the performance of the semiconductor device (high speed and low power consumption) cannot be improved. This represent large problems. Furthermore, a porous film with a low mechanical strength deteriorates the reliability of the semiconductor device.

SUMMARY OF THE INVENTION

Considering the above problems, the object of the invention is to provide a composition for forming a porous film having a desirably controlled thickness, wherein the film can be easily formed using the usual semiconductor process and the film has a mesopore channel structure which excels in stability m is. Another purpose of this invention is to provide a high-performing and highly reliable semiconductor device which contains the porous film inside.

The inventors have studied hard for the development of the coating liquid for forming the above porous film and then found the composition for forming porous film, which has a mesopore channel structure, and the manufacturing method of the porous film, which is applicable in the semiconductor manufacturing process. Thus, the invention is completed.

According to the invention, provided is a composition for forming a porous film comprising a surfactant, an aprotic polar solvent and a solution comprising a polymer formed by hydrolysis and condensation of one or more silane compounds represented by formula (1): $R_nSi(OR')_{4-n}$ wherein R represents a linear or branched alkyl group having 1 to 8 carbons or an aryl group, and when there are two or more Rs, the Rs may be independently same or different; R' represents an alkyl group having 1 to 4 carbons, and when there are two or more R's, the R's may be independently same or different; and n is an integer from 0 to 3.

According to the invention, provided is a method for manufacturing a porous film comprising steps of applying said composition to a substrate so as to form a film thereon, drying the film and transforming the dried film to a porous film by removing said surfactant such as quarternary ammonium salt. A porous film formable by said composition is provided.

The semiconductor device of the invention comprises a porous film therein, the porous film being formed by a composition comprising a surfactant, an aprotic polar solvent and a solution comprising a polymer formed by hydrolysis and condensation of one or more silane compounds represented by formula (1):

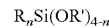

wherein R represents a linear or branched alkyl group having 1 to 8 carbons or an aryl group, and when there are two or more Rs, the Rs may be independently same or different; R' represents an alkyl group having 1 to 4 carbons, and when there are two or more R's, the R's may be independently same or different; and n is an integer from 0 to 3. Specifically, said porous film may be used as an insulator film of the multi-level interconnects in the semiconductor device.

Thus, keeping the mechanical strength of the semiconductor device secured, the hygroscopic property of the porous film is decreased. Hence, the semiconductor device with a built-in insulator film having a low dielectric constant is obtained. Because of lowering dielectric constant of the insulator film, the parasitic capacitance of the area around the multi-level interconnects is decreased, leading to the high-speed operation and low power consumption of the semiconductor device.

Moreover, it is preferable for the semiconductor device of the invention that said porous film is between metal interconnections in a same layer of multi-level interconnects or between upper and lower metal interconnection layers. This arrangement can achieve a high-performing and highly reliable semiconductor device.

Use of the composition for forming a porous film of the invention facilitates the formation of a porous film having a stable mesoporous channel structure at a desirably controlled thickness. The porous film has a low dielectric constant, and excels in adhesion, film uniformity, and mechanical strength. In addition, use of the porous film formed by the composition of the invention as the insulator film of the multi-level interconnects can produce a high-performing and highly reliable semiconductor device.

DETAILED DESCRIPTION OF THE PREFERRED EMBODIMENTS

Figure 1:
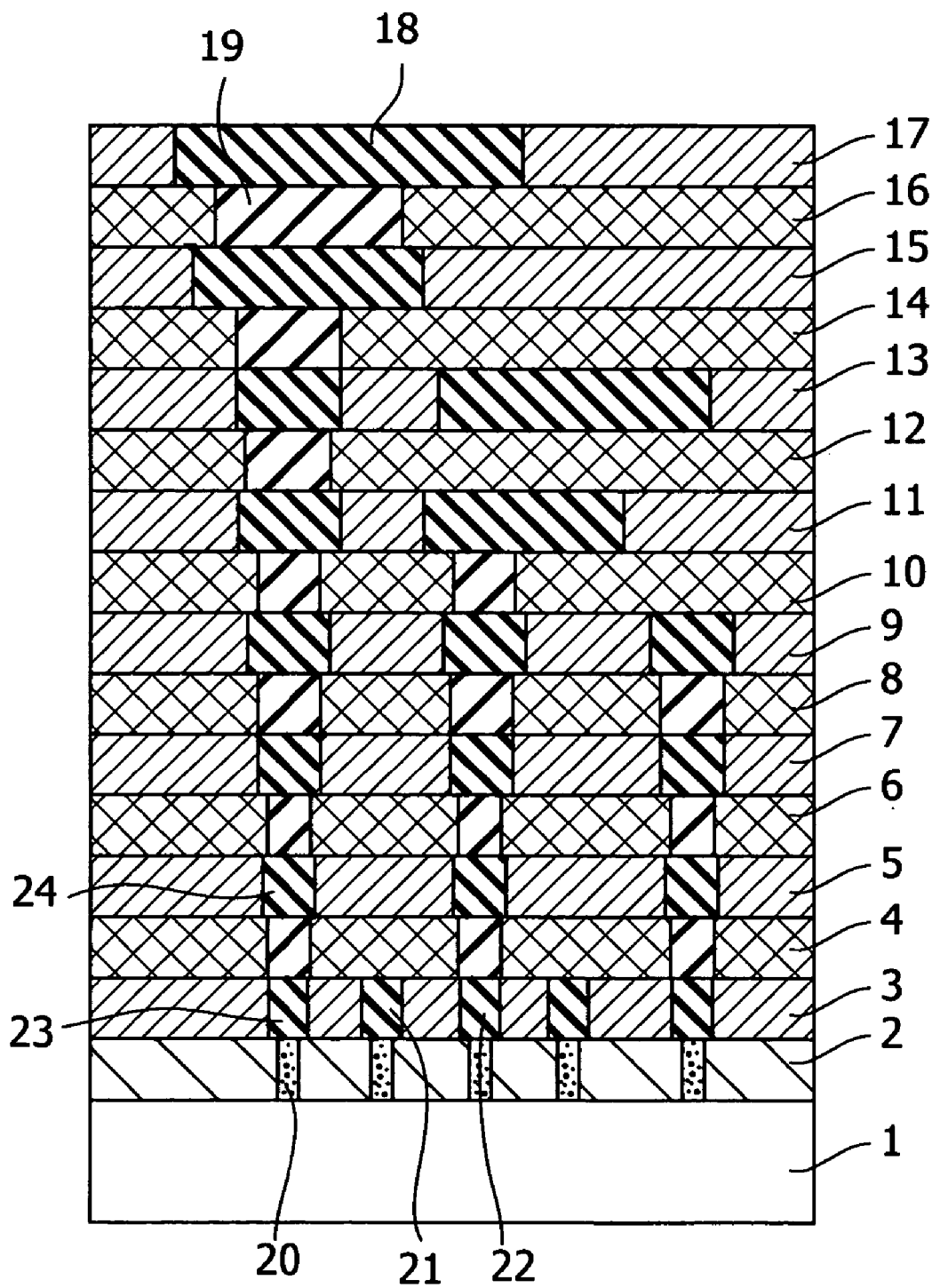
FIG. 1 is a schematic cross-sectional view of a semiconductor device of the present invention.

The silane compound used in this invention is represented by formula (1) wherein R represents a linear or branched alky group having 1 to 8 carbons or aryl group and may have a substituent. The R may include methyl, ethyl, propyl, isopropyl, butyl, isobutyl, sec-butyl, tert-butyl, pentyl, sec-pentyl, neopentyl, hexyl, 2-ethylhexyl, heptyl, octyl, phenyl, o-tolyl, m-tolyl, p-tolyl, xylyl and benzyl.

In formula (1), R' represents an alkyl group having 1 to 4 carbons. The R' may include methyl, ethyl, propyl, isopropyl and butyl. In formula (1), n is an integer from 0 to 3.

The silane compound represented by formula (1) may include, but are not limited to, tetramethoxysilane, tetraethoxysilane, tetrapropoxysilane, tetrabutoxysilane, methyltrimethoxysilane, methyltriethoxysilane, methyltripropoxysilane, ethyltrimethoxysilane, propyltrimethoxysilane, butyltrimethoxysilane, pentyltrimethoxysilane, hexyltrimethoxysilane, 2-ethylhexyltrimethoxysilane, phenyltrimethoxysilane, dimethyldimethoxysilane, dimethyldiethoxysilane, trimethylmethoxysilane, triethylmethoxysilane and butyldimethylmethoxysilane.

The silane compound solution becomes a polymer solution by hydrolysis and condensation. The silane compound is preferably subjected to hydrolysis and condensation in the present of water under an acidic condition using acid as catalyst to yield a polymer solution. The acid used in this case may include mineral acid such as hydrochloric acid, sulfuric acid and nitric acid; sulfonic acid such as methanesulfonic acid, benzenesulfonic acid, p-toluenesulfonic acid and trifluoromethanesulfonic acid; organic acid such as formic acid, acetic acid, propionic acid, oxalic acid, malonic acid, fumaric acid, maleic acid, tartaric acid, citric acid and malic acid; and phosphoric acid. The water for the hydrolysis may be preferably 0.5 to 10 times, more preferably 1.0 to 4.0 times the amount (mole) of water required to hydrolyze the silane compound completely.

The polymer solution can be produced also under an alkali condition. The base used in this case may include amines such as ammonia, ethylamine, propylamine, diisopropylamine, triethylamine, and triethanolamine; alkali metal hydroxide or alkali earth metal hydroxides such as sodium hydroxide, potassium hydroxide and calcium hydroxide.

The acid or alkali catalyst for the hydrolysis and condensation should be selected carefully so that the surfactant will not be decomposed in the presence of the acid or alkali catalyst so as to allow the surfactant to work. For example, it is necessary to avoid the decomposition of quarternary ammonium salt in the presence of a strong base into amine. It is because the decomposition of quarternary ammonium salt will prevent it from functioning as a surfactant. The preferable combination may include acid catalyst and quaternary ammonium salt which can produce micelle as dissolved.

When the silane compound represented by formula (1) is subjected to the hydrolysis and condensation to form a polymer solution, solvent other than water may be added. The solvent may include alcohol which corresponds to the alkoxy group of the silane compound. The alcohol may include methanol, ethanol, isopropyl alcohol, butanol, propylene glycol monomethyl ether, propylene glycol monopropyl ether, propylene glycol monopropyl ether acetate, ethyl lactate and cyclohexanone. The solvent other than water may be added in the weight of preferably 0.1 to 10 times, more preferably 0.5 to 2 times the weight of the silane compound.

The hydrolysis and condensation reaction of the silane may be carried out in a usual condition of the conventional hydrolysis and condensation reaction. The reaction temperature may be typically from 0° C. to a boiling point of the alcohol generated by the hydrolysis and condensation, preferably from room temperature to 60° C.

The reaction time may not be especially limited. It may typically take from 10 minutes to 18 hours, more preferably 30 minutes to about 3 hours.

The preferable weight-average molecular weight of the polymer obtained from the silane compound represented by formula (1) may be 500 to 50,000 based on polystyrene with Gel Permeation Chromatography (GPC).

The polymer solution produced in the above manner may be used as it is, or may be used as the solution to which a smaller amount of one or more other components have been added. The other component may include titanium oxide, aluminum oxide and zirconium oxide and may be added in an amount of 0 to 20 wt % based on the weight of the main component, the silane compound of formula (1).

The surfactant used in the invention may be preferably the quaternary ammonium salt which can form micelle as dissolved.

Any quaternary ammonium salt may be used as long as the quaternary ammonium salt can form micelle when it is added to the polymer solution and dissolve therein. Any cationic surfactant can be generally used.

It should be noted that the surfactant such as quaternary ammonium salt can be added to a solution of the silane compound so as to allow the polymerization reaction to take place in the solution.

The quaternary ammonium salt used in the invention may be preferably alkyltrimethylammonium salt represented by formula (2):

$$R''N+(CH_3)_3X— \qquad (2)$$

Wherein R" represents a linear or branched alkyl group having 8 to 20 carbons and X represents an atom or a functional group which can form an anion.

The particularly preferable quaternary ammonium salt may be alkyltrimethylammonium salt where the alkyl group is a linear alkyl group having 12 of 18 carbons. The examples may include, but are not limited to, dodecyltrimethylammonium chloride, dodecyltrimethylammonium bromide, dodecyltrimethylammonium iodide, tetradecyltrimethylammonium chloride, tetradecyltrimethylammonium bromide, tetradecyltrimethylammonium iodide, hexadecyltrimethylammonium chloride, hexadecyltrimethylammonium bromide, hexadecyltrimethylammonium iodide, hexadecyltrimethylammonium formate, hexadecyltrimethylammonium acetate, hexadecyltrimethylammonium oxalate, hexadecyltrimethylammonium trifluoroacetate, hexadecyltrimethylammonium methanesulfonate, hexadecyltrimethylammonium trifluoromethanesulfonate, hexadecyltrimethylammonium hydroxide, stearyltrimethylammonium chloride and stearyltrimethylammonium bromide.

The surfactant such as the quaternary ammonium salt may be dissolved uniformly in the silane solution or the polymer solution only by mixing or stirring. However, the maximum amount of surfactant which can be dissolved uniformly differs depending on the type of surfactant such as the quaternary ammonium salt. Accordingly, the amount of surfactant may be variable. The amount of the surfactant may be typically from 0.01 to 0.5 mol % of the amount (mole) of the silane compound (mole) of formula (1).

The solution containing the silicon polymer and the surfactant such as quaternary ammonium salt is applied to a substrate to form a film. Then the film is sintered so that the surfactant will be removed off, thereby a porous film will be obtained at the end. However, there is a problem that it is difficult to control the film thickness during the coating because the coating liquid contains alcohol and water as only solvents, where the alcohol has been generated by the hydrolysis and condensation of starting silane and corresponds to the alkoxy group of the starting silane, and water has been added for the hydrolysis and condensation.

To solve the above problem, the inventors have studied keenly and found that a film having a desirable thickness can be formed by controlling a concentration of a composition solution by dilution with a certain kind of solvent and by controlling a coating condition, and the film thus formed can become a porous film having a mesopore channel structure by removing the surfactant such as quaternary ammonium salt with heat or with solvent extraction. Then, the invention is completed. The composition obtained is also found to have higher storage stability in comparison to a non-diluted composition.

When water is used as solvent to dilute the composition, the condensation of polymers progresses rapidly so that gelling is usually observed after the composition diluted with water is left overnight at room temperature. When water or ethylene glycol is used as solvent for the dilution, the stability is lowered and gelling speed increases. On the other hand, when aprotic solvent is used, the process of reaching a high molecular weight is suppressed so that the stability increases.

The solvent for dilution may be aprotic polar solvent, which is a polar solvent having no active hydrogen. The aprotic polar solvent may preferably have a dielectric constant of 20 or more, more preferably 20 to 50. When the dielectric constant is lower than 20, it may be difficult for the surfactant such as quaternary ammonium hydroxide to form micelle so that the channel structure may not be formed. Consequently, the film may shrink during the removal of the surfactant so that it may not become porous.

The solvent for dilution may preferably include (the figure in parentheses indicates the dielectric constant) acetonitrile (37.5), propionitrile (29.7), isobutyronitrile, N-methylpyrrolidone, N,N-dimethylformamide (36.7), N,N-dimethylacetamide (37.8), dimethylsulfoxide (48.8), hexamethylphosphortriamide (29.6), nitrobenzene and nitromethane. It may more preferably include acetonitrile, propionitrile, isobutyronitrile and nitromethane.

Unsuitable solvent for dilution may include water (80.1), ethylene glycol (37.7), ethyl acetate (6.02) and methyl isobutyl ketone (13.1).

A film having a desirable thickness can be formed by spin-coating an appropriately controlled concentration of the coating liquid with an appropriate number of spin rotations. For example, the actual film thickness of the film may be about 0.2 to 1 µm, but not limited to this range. For example, by applying the coating solution several times, the thickness of the thin film can be increased. The method of coating other than spin coating may include scan coating. The amount of the solvent for dilution may be preferably 10 to 500% by volume, more preferably 20 to 300% by volume based on the volume of solution before the dilution.

The film thus prepared may be heated preferably for several minutes at 50° C. to 150° C. in a drying step (generally called a pre-bake in the semiconductor process) so as to remove the solvent.

The film thus formed will be made porous in the following methods. In one method, the surfactant such as ammonium salt is removed by decomposition, evaporation or sublimation thereof caused by heating or calcinations at a high temperature so that spaces of thin film where the surfactant has been occupied will become pores. The temperature may be temperature sufficient for the surfactant such as ammonium salt to decompose, evaporate or sublime and typically 200 to 400° C.

In another method, the surfactant such as quaternary ammonium salt is dissolved in solvent so as to be removed. The solvent may be any solvent as long as it can dissolve the surfactant but does not dissolve the resin matrix. The solvent may include, but are not limited to, methanol, ethanol, isopropanol, acetone, methyl ethyl ketone, methyl isobutyl ketone, ether, ethyl acetate, n-butyl acetate, isobutyl acetate, benzene, toluene, xylene, anisole, N-methylpyrrolidone, N,N-dimethylformamide, N,N-dimethylacetamide, dimethylsulfoxide, hexamethylphosphortriamide, nitrobenzene and nitromethane. Although the solvent may be used at room temperature, it can be also used after being heated.

The film to which the surfactant such as quaternary ammonium salt has been removed has a very large specific surface area, typically 2,000 to 4,000 $m^2/g$, according to the BET surface area method using adsorption of a nitrogen gas. Consequently, a film having a very small dielectric constant can be produced. For example, the film of the invention may have dielectric constant of 1.5 to 2.5 of when measured with an automatic mercury probe.

Moreover, the porous film produced in the above method may have an extremely narrow pore distribution, usually in the range of 1 to 3 nm and have almost no pores exceeding 3 nm. It can be confirmed by the BET surface area measurement using gas adsorption.

The obtained porous film has excellent mechanical strength although the percentage of the pores in the entire film is extremely high. It is because of uniform pore distribution in the micro-pore channel structure. The film may typically have hardness of 0.5 to 1.5 GPa and modulus of about 5.0 to 10 GPa when measured with nanoindentation. This indicates that the obtained film has much higher mechanical strength than the porous material produced by adding a thermally decomposable polymer to siloxane resin and thermally removing the polymer so as to form pores. It is because the material has hardness of 0.05 to 2 GPa and modulus of about 1.0 to 4.0 GPa.

The porous film of the present invention is particularly preferable as the interlevel insulator film of the interconnections in a semiconductor integrated circuit. The semiconductor device is required to reduce interconnection capacitance in order to prevent interconnection delay when highly integrated. Various means have been developed to achieve this, and one of them is to reduce the relative permittivity of the interlevel insulator film disposed between metal interconnections. When an interlevel insulator film is prepared by using the composition for forming a porous film of the present invention, the semiconductor device can be downsized and faster and consume less power.

However, there is a conventional problem that when a porous film is prepared by introducing pores in the film so as to lower the dielectric constant, the mechanical strength of the film decreases as the density of the material composing the film decreases. The decrease in mechanical strength not only affects the strength of the semiconductor device itself but also causes exfoliation due to insufficient strength in a chemical mechanical polishing process which is generally used in the fabrication process. Particularly, when used as the interlevel insulator film of a semiconductor, the porous film of the present invention with high mechanical strength and low relative permittivity prevents such exfoliation, thereby greatly improving the reliability of the manufactured semiconductor device.

The embodiments of the semiconductor device of the present invention will be described below. FIG. 1 shows an schematic cross-sectional view of an example of the semiconductor device of the present invention.

In FIG. 1, the substrate 1 is an Si semiconductor substrate such as an Si substrate or an SOI (Si-on-insulator) substrate; however, it can be a compound semiconductor substrate such as SiGe or GaAs. The interlevel insulator films include the interlevel insulator film 2 of the contact layer; the interlevel insulator films 3, 5, 7, 9, 11, 13, 15, and 17 of the interconnection layers; and the interlevel insulator films 4, 6, 8, 10, 12, 14, and 16 of the via layers. The interconnection layers corresponding to the lowermost interlevel insulator film 3 through the uppermost insulator film 17 are abbreviated as M1, M2, M3, M4, M5, M6, M7, and M8, respectively. The via layers corresponding to the lowermost interlevel insulator film 4 through the uppermost insulator film 16 are abbreviated as V1, V2, V3, V4, V5, V6, and V7, respectively. Although some of the metal interconnections are referred to with the numbers 18 and 21 to 24, the other regions with the same pattern not labeled with numbers indicate metal interconnections. The via plug 19 is made from a metal. In the case of copper interconnection, copper is generally used. The regions having the same pattern as the via plug 19 represent via plugs although they are not labeled with numbers in the drawing. The contact plug 20 is connected to the gate of the transistor (not illustrated) formed on the top surface of the substrate 1 or to the substrate. Thus, the interconnection layers and the via layers are alternately stacked, and multi-level interconnections generally indicate M1 and regions higher than M1. In general, M1 to M3 are called local interconnections, M4 and M5 are called intermediate interconnections or semi-global interconnections, and M6 to M8 are called global interconnections.

In the semiconductor device of the present invention, the porous film of the present invention is used as one or more of the interlevel insulator films 3, 5, 7, 9, 11, 13, 15, and 17 of the interconnection layers or the insulator films 4, 6, 8, 10, 12, 14, and 16 of the via layers.

For example, when the porous film of the present invention is used for the interlevel insulator film 3 of the interconnection layer (M1), the interconnection capacitance between the metal interconnection 21 and the metal interconnection 22 can be greatly reduced. When the porous film of the present invention is used for the interlevel insulator film 4 of the via layer (V1), the interconnection capacitance between the metal interconnection 23 and the metal interconnection 24 can be greatly reduced. Using the porous film with a low relative permittivity of the present invention as an interconnection layer can greatly reduce the metal interconnection capacitance in the same layer. On the other hand, using the porous film with a low relative permittivity of the present invention as a via layer can greatly reduce the interlevel capacitance between the vertical metal interconnections.

Therefore, using the porous film of the present invention for all of the interconnection layers and the via layers can greatly reduce the parasitic capacitance of the interconnections. Hence, the use of the porous film of the present invention as insulator films of the interconnections prevents a conventional problem, that is, an increase in the dielectric constant resulting from the porous film absorbing humidity while multi-level interconnections are formed by stacking porous films. Consequently, the semiconductor device can perform high-speed and low-power operations.

The porous film of the present invention enables a semiconductor device to have higher mechanical strength by its high mechanical strength, thereby greatly improving the yield of the fabrication and the reliability of the semiconductor device.

The present invention will be described specifically through the following examples and comparative examples, but is not limited to the examples.

EXAMPLES 1–6

The mixture of 30.4 g tetramethoxysilane and 8.0 g water was stirred at room temperature, while 0.2 ml hydrochloric acid was added thereto all at once. After stirred for a few minutes, the reacting solution generated heat and became a uniform solution. It was stirred 1 hour further at room temperature, producing a slightly viscous solution. According to the analysis with a gel permeation chromatography using tetrahydrofuran as a moving bed, the siloxane produced had weight-average molecular weight of 1,250 and number average molecular weight of 822 based on polystylene. The 6.82 g trimethyloctadecylammonium chloride was added to this solution and stirred to produce a uniform solution. Then an additional one hour of agitation produced a transparent and colorless solution.

This was used as a stock solution. The composition for forming porous film was obtained by diluting the stock solution with a prescribed quantity of solvent as shown in Table 1, wherein DMF is N,N-dimethylformamide, DMAc is N,N-dimethylacetamide, HMPA is hexamethylphosphortriamide and DMSO is dimethyl-sulfoxide.

COMPARATIVE EXAMPLES 1–4

The above stock solution was diluted with a prescribed amount of water, ethylene glycol, ethyl acetate or ethyl isobutyl ketone as shown in Table 1 to produce the compositions.

TABLE 1

| | stock solution | solvent for dilution | | stability |
|---|---|---|---|---|
| | weight | solvent | weight | for storage |
| Example 1 | 5 g | acetonitrile | 5 g | stable*1 |
| Example 2 | 5 g | propionitrile | 5 g | stable*1 |
| Example 3 | 5 g | DMF | 5 g | stable*1 |
| Example 4 | 5 g | DMAc | 5 g | stable*1 |
| Example 5 | 5 g | HMPA | 5 g | stable*1 |
| Example 6 | 5 g | DMSO | 5 g | stable*1 |
| Comp. Ex. 1 | 5 g | water | 5 g | unstable*2 |
| Comp. Ex. 2 | 5 g | ethylene glycol | 5 g | unstable*2 |
| Comp. Ex. 3 | 5 g | ethyl acetate | 5 g | stable*1 |
| Comp. Ex. 4 | 5 g | methyl isobutyl ketone | 5 g | stable*1 |

*1No gellation even after one week at rooom temperature.
*2Gellation in one day at room temperature.

As shown in Table 1, the solutions of Comparative Examples 1–2 was gelled and insoluble in solvent after being left at room temperature for one day. However, the solutions in Examples 1–6 and Comparative Examples 3–4 were not gelled and showed almost no increase of molecular weight even after being left at room temperature for one week.

EXAMPLES 7–13

The mixture of 15.2 g tetramethoxysilane, 13.6 g methyltrimethoxysilane and 7.0 g water was stirred, while 0.2 ml of 1N hydrochloric acid solution was added all at once thereto. After stirred for a few minute, the reacting solution generated heat and became a uniform solution. It was stirred 1 hour further at room temperature, and the resulting solution was analyzed with a gel permeation chromatography. It had weight-average molecular weight of 1,872 and number average molecular weight of 839 based on polystylene. The 6.4 g trimethylhexadecylammonium chloride was added to this solution and stirred further for one hour produced a transparent and colorless solution.

This was used as a stock solution. The composition for forming porous film was obtained by diluting the stock solution with a prescribed quantity of solvent as shown in Table 2.

COMPARATIVE EXAMPLES 5–7

The above stock solution was diluted with a prescribed amount of solvent as shown in Table 2 so that the compositions were obtained.

TABLE 2

| | stock solution | solvent for dilution | | stabiltiy |
|---|---|---|---|---|
| | wieght | solvent | weight | for storage |
| Example 7 | 5 g | nitromethane | 5 g | stable*1 |
| Example 8 | 5 g | acetonitrile | 5 g | stable*1 |
| Example 9 | 5 g | propionitrile | 5 g | stable*1 |
| Example 10 | 5 g | DMF | 5 g | stable*1 |
| Example 11 | 5 g | DMAc | 5 g | stable*1 |
| Exampe 12 | 5 g | HMPA | 5 g | stable*1 |
| Example 13 | 5 g | DMSO | 5 g | stable*1 |
| Comp. Ex. 5 | 5 g | water | 5 g | unstable*2 |
| Comp. Ex. 6 | 5 g | ethyl acetate | 5 g | stable*1 |
| Comp. Ex. 7 | 5 g | methyl isobutyl ketone | 5 g | stable*1 |

*1No gellation even after one week at room temperature.
*2Gellation in one day at room temperature.

As shown in Table 2, the solution of Comparative Example 5 was gelled and insoluble in solvent after being left at room temperature for one day. However, the solutions in Examples 7–13 and Comparative Examples 6–7 were not gelled and showed almost no increase of molecular weight even after being left at room temperature for one week.

COATING EXAMPLE 1

The solution in Example 1 was applied on an 8 inch wafer with a spin coater at 2,000 rpm for 1 minute to produce a film on the wafer. The film was heated on a hot plate at 100° C. for 1 minute. Then, the film had thickness of 12,600 Å. After the film was further heated at 150° C. for 1 minute, it was heated at 400° C. for 1 hour in a nitrogen atmosphere in a clean oven. The obtained film had thickness of 10,200 Å. The dielectric constant of the coated film had 1.8 in a CV method using an automatic mercury probe. Moreover, it had specific surface area of 3,100 m$^2$/g according to the method of gas adsorption. A central value of the pore diameters was 2.0nm and it was confirmed that the pores having pore size of more than 3.0 nm did not substantially existed. The film had modulus of 8.5 GPa according to the measurement of a Nanoindenter.

COATING EXAMPLES 2–8

Each solution in Examples 2–8 and 10–11 was used as a coating liquid and processed in the same manner as Coating Example 1. The dielectric constant and modulus obtained are shown in Table 3.

COMPARATIVE COATING EXAMPLE 3

The solution of Comparative Example 3 was applied on an 8 inch wafer with a spin coater at 1,500 rpm for 1 minute to produce a film on the wafer. The film was heated on a hot plate at 100° C. for 1 minute. Then, the film had thickness of 13,500 Å. After the film was further heated at 150° C. for 1 minute, it was heated at 400° C. for 1 hour in a nitrogen atmosphere in a clean oven. The obtained film had thickness of 7,300 Å. The dielectric constant of the coated film had 4.2 in a CV method using an automatic mercury probe. Moreover, it had specific surface area of 50 m$^2$/g according to the method of gas adsorption. Thus, it was found that the film was not porous.

COMPARATIVE COATING EXAMPLE 4

The solution of Comparative Example 4 was processed in the same manner as Coating Example 1. The obtained film had dielectric constant of 4.0 and specific surface area of 70 m$^2$/g. Thus, it was found that the film was not porous.

COMPARATIVE COATING EXAMPLE 7

The solution in Comparative Example 7 was processed in the same manner as Coating Example 1. The obtained film had dielectric constant of 4.4 and specific surface area of 80 m$^2$/g. Thus, it was found that the film was not porous.

TABLE 3

| | coating liquid | specific surface area (m$^2$/g) | dielectric constant | modulus (GPa) |
|---|---|---|---|---|
| Coating Ex. 1 | Ex. 1 | 3,100 | 1.8 | 8.5 |
| Coating Ex. 2 | Ex. 2 | — | 1.9 | 7.2 |
| Coating Ex. 3 | Ex. 3 | — | 2.0 | 8.0 |
| Coating Ex. 4 | Ex. 4 | — | 1.9 | 9.1 |
| Coating Ex. 5 | Ex. 5 | — | 1.8 | 7.0 |
| Coating Ex. 6 | Ex. 6 | — | 1.9 | 7.5 |
| Coating Ex. 7 | Ex. 7 | — | 2.0 | 7.2 |
| Coating Ex. 8 | Ex. 8 | — | 2.0 | 7.9 |
| Coating Ex. 10 | Ex. 10 | — | 2.1 | 8.0 |
| Coating Ex. 11 | Ex. 11 | — | 1.9 | 8.2 |
| Comp. Coating Ex. 3 | Comp. Ex. 3 | 50 | 4.2 | — |
| Comp. Coating Ex. 4 | Comp. Ex. 4 | 70 | 4.0 | — |
| Comp. Coating Ex. 7 | Comp. Ex. 7 | 80 | 4.4 | — |

The invention claimed is:

1. A composition for forming a porous film comprising a surfactant, an aprotic polar solvent and a solution comprising a polymer formed by hydrolysis and condensation of one or more silane compounds represented by formula (1):

$$R_nSi(OR')_{4-n}$$

wherein each R independently represents a linear or branched alkyl group having 1 to 8 carbons or an aryl group, and when there are two or more Rs, each R may be the same or different; each R' independently represents an alkyl group having 1 to 4 carbons, and when there are two or more R's, each R' may be the same or different; and n is an integer from 0 to 3.

2. The composition for forming a porous film according to claim 1 wherein said surfactant is a quaternary ammonium salt which can form a micelle when dissolved.

3. The composition for forming a porous film according to claim 1 wherein said quaternary ammonium salt is an alkyltrimethylammonium salt represented by formula (2):

$$R''N^+(CH_3)_3X^-$$

wherein R" represents a linear or branched alkyl group having 8 to 20 carbons and X represents an atom or functional group which can form an anion.

4. The composition for forming a porous film according to claim 1 wherein said aprotic polar solvent has a dielectric constant of 20 or more.

5. The composition for forming a porous film according to claim 1 wherein said aprotic polar solvent is one or more selected from the group consisting of acetonitrile, propionitrile, isobutyronitrile, N-methylpyrrolidone, N,N-dimethylformamide, N,N-dimethylacetamide, dimethylsulfoxide, hexamethylphosphortriamide, nitrobenzene and nitromethane.

6. A method for manufacturing a porous film comprising the steps of applying a composition according to claim 1 to a substrate so as to form a film thereon, drying the film and transforming the dried film to a porous film by removing said surfactant.

7. A porous film formable by a composition according to claim 1.

8. An interlevel insulating film formable by a composition according to claim 1.

* * * * *